United States Patent
Spatenka

(10) Patent No.: US 8,299,714 B2
(45) Date of Patent: Oct. 30, 2012

(54) APPLICATOR OF MICROWAVE PLASMA GENERATOR AND MICROWAVE PLASMA GENERATOR INCLUDING THIS APPLICATOR

(76) Inventor: Petr Spatenka, Ceské Budejovice (CZ)

( * ) Notice: Subject to any disclaimer, the term of this patent is extended or adjusted under 35 U.S.C. 154(b) by 411 days.

(21) Appl. No.: 12/677,887

(22) PCT Filed: Sep. 12, 2008

(86) PCT No.: PCT/CZ2008/000106
§ 371 (c)(1),
(2), (4) Date: May 3, 2010

(87) PCT Pub. No.: WO2009/033437
PCT Pub. Date: Mar. 19, 2009

(65) Prior Publication Data
US 2010/0301753 A1 Dec. 2, 2010

(30) Foreign Application Priority Data

Sep. 13, 2007 (CZ) .................. 2007-19202

(51) Int. Cl.
*H05B 31/26* (2006.01)
(52) U.S. Cl. .......... 315/111.21; 315/111.31; 315/111.71
(58) Field of Classification Search ............. 315/111.21, 315/111.31, 111.71
See application file for complete search history.

(56) References Cited

U.S. PATENT DOCUMENTS

| 5,522,934 | A | * | 6/1996 | Suzuki et al. | .......... | 118/723 AN |
|---|---|---|---|---|---|---|
| 5,538,699 | A | | 7/1996 | Suzuki | | |
| 5,939,831 | A | * | 8/1999 | Fong et al. | ............... | 315/111.21 |
| 6,162,323 | A | * | 12/2000 | Koshimizu | ............... | 156/345.26 |
| 6,270,862 | B1 | * | 8/2001 | McMillin et al. | ............. | 427/569 |
| 6,335,535 | B1 | * | 1/2002 | Miyake et al. | ............. | 250/492.21 |
| 6,607,633 | B2 | * | 8/2003 | Noguchi | .................. | 156/345.41 |
| 6,652,709 | B1 | * | 11/2003 | Suzuki et al. | ............ | 156/345.41 |
| 6,727,654 | B2 | * | 4/2004 | Ogawa et al. | ............ | 315/111.01 |
| 7,415,940 | B2 | * | 8/2008 | Koshimizu et al. | ........ | 118/723 E |
| 2001/0050058 | A1 | | 12/2001 | Yamamoto et al. | | |
| 2002/0002948 | A1 | * | 1/2002 | Hongo et al. | ............. | 118/723 R |
| 2004/0026039 | A1 | | 2/2004 | Goto et al. | | |
| 2004/0051464 | A1 | * | 3/2004 | Ishii et al. | ................ | 315/111.21 |
| 2004/0182702 | A1 | * | 9/2004 | Chistyakov | ............... | 204/298.36 |
| 2005/0034815 | A1 | * | 2/2005 | Kasai et al. | ............. | 156/345.41 |
| 2009/0011146 | A1 | * | 1/2009 | Yamada et al. | ............... | 427/575 |

FOREIGN PATENT DOCUMENTS

WO 2006/109754 A1 10/2006

OTHER PUBLICATIONS

International Search Report: PCT/CZ2008/000106.

* cited by examiner

*Primary Examiner* — Jason M Crawford
(74) *Attorney, Agent, or Firm* — Ladas & Parry LLP

(57) ABSTRACT

The microwave plasma generator is applied to transmission of electromagnetic field into plasma. The invention consists of the fact that the guiding part (3) has two outputs (4, 4') between which an input (2) of microwave is placed generated from the microwave power source (5). The input (2) is in the distance (A) from the separation (10) of the first output (4) and in the distance (B) from the separation (10') of the second output (4') while the absolute value of the difference of the distances A-B or B-A equals λ/2 where λ is the wave length of the microwave and distances A and B correspond to the trajectory of microwave propagation. A microwave plasma generator including microwave power source (magnetron) (5) is connected to the input (2) of the guiding part (3) of the applicator (1).

5 Claims, 2 Drawing Sheets

APPLICATOR OF MICROWAVE PLASMA GENERATOR AND MICROWAVE PLASMA GENERATOR INCLUDING THIS APPLICATOR

BACKGROUND AND SUMMARY OF THE INVENTION

The invention relates to an applicator of microwave plasma generator applied to transmission of electromagnetic field into plasma and it further relates to a microwave plasma generator including the dealt with applicator.

A large scale of types of microwave plasma generators that can be, in general, characterized as closed generators where the plasma chamber is surrounded by metal walls forming a microwave resonator, or as open generators including among others microwave emitters, slow-wave structures and surfatrons, eventually generators with magnetic field based on electron resonance ECR (electron cyclotron resonance).

The known microwave plasma generator consists from a microwave power source (magnetron), wave-guide, circulator and from an applicator ensuring transfer of microwave energy into plasma filler (plasma bulk).

The Horn antenna is most frequently used in current microwave plasma generators as applicator, which in fact is a casing with an input in one side and with a rectangle profile cross section enlarging towards the output provided with a dielectric window on the other side. The applicator transmits linearly polarized waves. It is connected to a wave-guide in which also a circulator is connected necessary for conduction of reflected waves.

One of the general problems in transmission of electromagnetic field to plasma is the fact that a certain part of the supplied power is reflected back. The generated plasma has some electrical conductivity and it therefore does not absorb all waves a part of which is then reflected back. This problem is significant especially in microwave generators since the reflected waves are transmitted via the wave-guide back to the source (magnetron). A long time charging of the magnetron by the reflected wave can result in the destruction thereof. To avoid this effect the reflected wave must be conducted outside of the magnetron. Therefore between the magnetron and the applicator into the track of the wave-guide a circulator is included to ensure the exhaust of the reflected wave and its transformation into heat. Even though the circulator is an efficient device, it is relatively complicated and expensive. It increases considerably the size, complexity and price of the known microwave plasma generators. Besides in order to tune the applicator, the microwave guide must be terminated by a movable short connection (movable wall), serving to tune the guide in order to achieve the maximum efficiency of the applicator.

The invention aims at creating such microwave plasma generator that could remove the above described deficiencies and that would allow an efficient elimination of a part of the reflected wave without the necessity of application of the above-described complicated, expensive and bulky elements.

This task is solved by formation of an applicator and a microwave plasma generator including the said applicator according to this invention.

The invention consists of the fact that it is possible to interfere the reflected waves by other reflected waves of the same wave length but with an appropriate phase shift. This is achieved by an applicator with a guiding part of the closed profile and with two outputs in the opposite ends. In the separations of both outputs and the plasma field reflected waves are generated and they reflect back against each other into the guiding part where they meet and interfere. An efficient elimination of the impact of the reflected waves on the microwave power source (magnetron) is surprisingly achieved by placing the magnetron directly in the input of the applicator placed in the wall of its guiding part in the distance A from the separation of the first output and in the distance B from the separation of the second output while the absolute value of the difference of the distances A-B or B-A equals $\lambda/2$ where $\lambda$ is the wave length of the microwave from the microwave power source (magnetron). Distances A and B correspond to the trajectory of microwave propagation.

Then the waves from the opposite outputs meet in the guiding part in the place of the input of the microwave power source (magnetron) with exactly the opposite polarity, which disturbs their impact resulting in liberating the magnetron from the impact of reflected waves.

In one preferred embodiment of the applicator the guiding part is fixed from one side to the metal vacuum flange provided with apertures placed on the near side against outputs of the guiding part. On the reverse side, these apertures are covered by the dielectric cover.

It is also advantageous when the guiding part has the shape of a hollow body abutting the flange and covering the apertures by its outputs.

This embodiment has a very small size and great variability; it can be put in any device having an aperture corresponding to the circular flange.

In another preferred embodiment of the applicator according to the invention the guiding part has in the top view approximately a "U" shape the branches of which are provided by outputs in the ends and the input is placed in one of the branches. A longer track and greater stability characterize this embodiment.

A microwave plasma generator is also subject of the invention. It includes a microwave power source (magnetron) and an applicator where the microwave power source is connected to the guiding part of the applicator, provided on one of its ends by the first output, on the second end by the second output and the input is placed in the wall of the guiding part in the distance A from the separation of the first output and in the distance B from the separation of the second output while the absolute value of the difference of the distances A-B or B-A equals $\lambda/2$ where $\lambda$ is the wave length of the microwave from the microwave power source (magnetron). Distances A and B correspond to the trajectory of microwave propagation.

The advantage of the above described applicator and microwave plasma generator including this present applicator consists in the fact that it is possible to exclude from construction of the device the expensive and bulky circulator including wave-guide and the tunable short connection of the microwave guide and that it is possible to create a simple, compact, easily transportable microwave plasma generator with a small size and low production costs.

BRIEF DESCRIPTION OF THE DRAWINGS

The invention will be presented in more detail in the drawings where.

EXAMPLES OF PREFERRED EMBODIMENTS

It should be understood that the hereinafter described and shown specific examples of embodiments of the invention are represented as examples only, not as a limitation of the invention. Those skilled in the art will find or will be able to find by routine experimenting a greater or smaller number of equivalents of the present invention, described here in a specific embodiment. Also these equivalents shall be included in the claims for protection.

Figure 1:
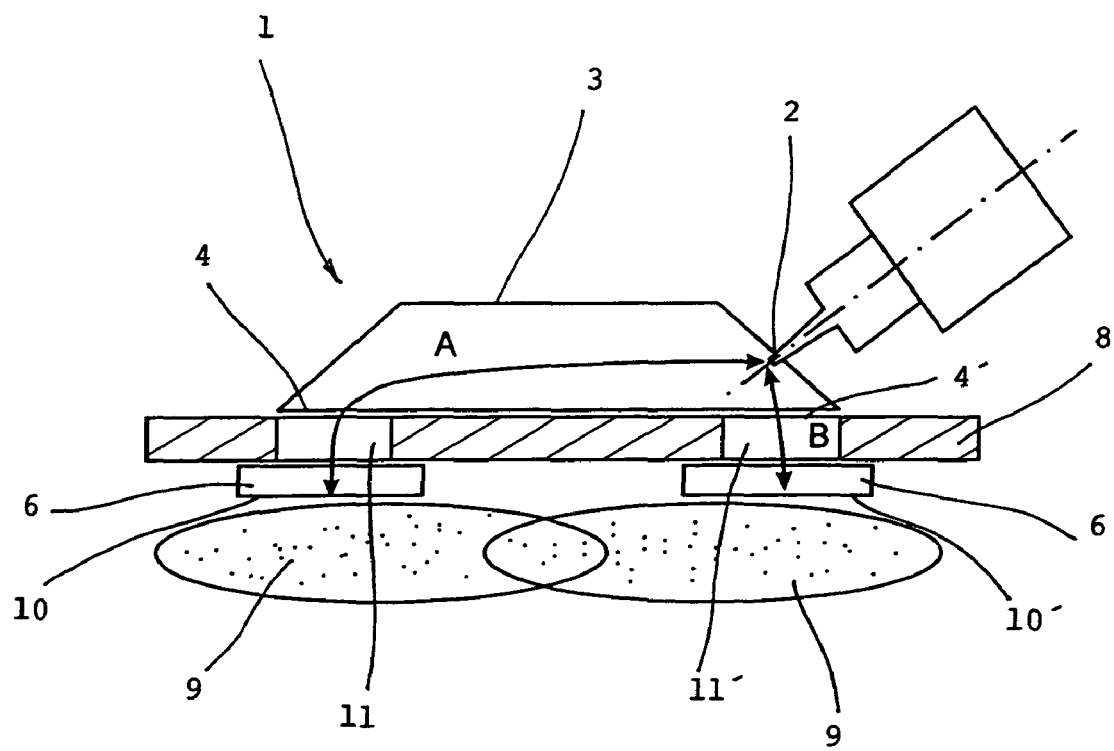
FIG. 1 is a schematic cross section of the open microwave plasma generator including the applicator with the guiding part of the shape of a hollow body and FIG. 2 is a schematic cross section of the open microwave plasma generator including the applicator having a "U" shape in cross section.

In one specific embodiment of the invention shown schematically in FIG. 1 there is shown an open microwave plasma generator supplied from a source of pulse voltage 3 kV not presented here adapted for plasma modification of powder materials on the polyethylene basis.

The microwave power source (magnetron) 5 is a Panasonic magnetron having 1 kW power with a pulse control of power, set in the wall of the guiding part 3 of the applicator 1 made of brass sheet. The guiding part 3 is of a hollow body shape with the first output 4 and the second output 4'. By the means of these two outputs 4, 4' the guiding part 3 connects with apertures 11, 11' in the circular vacuum aluminium flange 8 and it is screwed down to it. On the reverse side of the flange 8 the apertures 11, 11' are covered by dielectric covers 6, e.g. made of corundum or silica glass. The sides of the covers 6 reversed from the outputs 4, 4' create separations 11, 11' reflecting microwaves and behind which by each output 4, 4' a plasma bulk 9 is made. The whole applicator 1 can be by means of the flange 8 made in the dimension scale ISO, attached to any vessel, not represented here, which usually is a chamber of rustless sheet. It is essential that the input 2 of microwave from the microwave power source 5 be set in the guiding part 3, e.g. in its wall in the distance A from the separation 10 of the first output 4 and in the distance B from the separation 10' of the second output 4' while the following applies: the absolute value of the difference of distance A-B or B-A equals $\lambda/2$, i.e. the half of the wave length of the microwave power source 5 and distances A and B correspond to the trajectory of microwave propagation.

Figure 2:
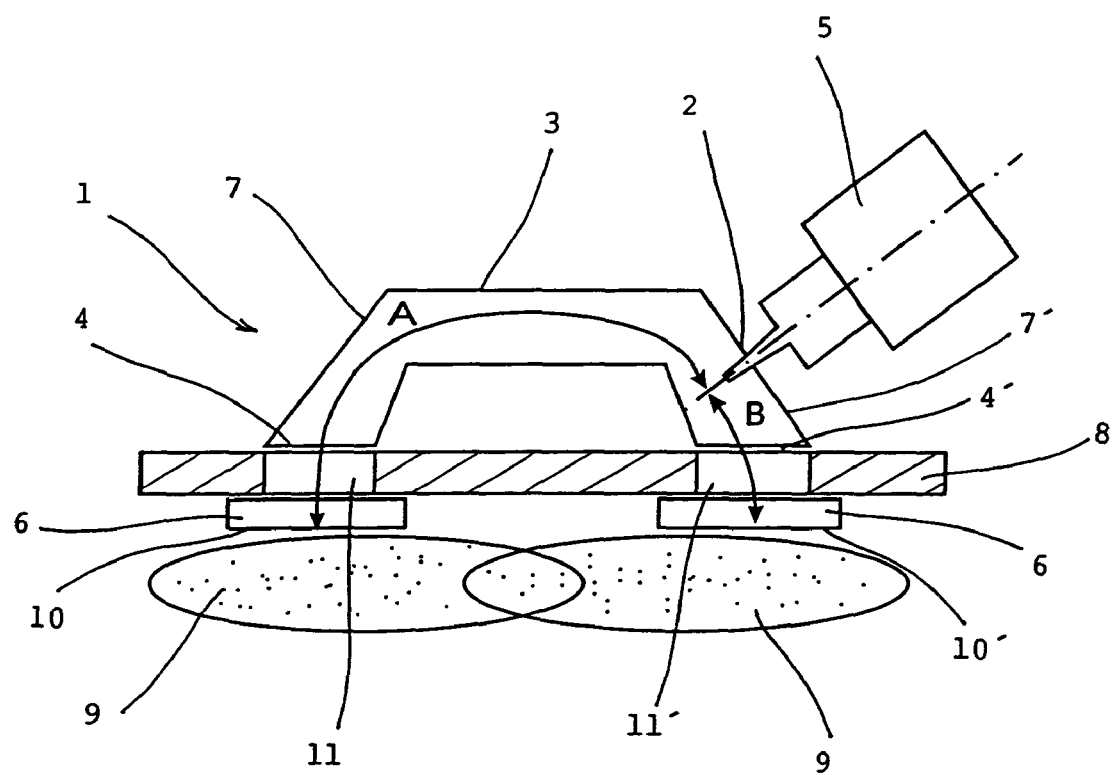

In FIG. 2 the same open microwave plasma generator is shown with a small modification consisting in the guiding part 3 having a "U" shape in cross section the branches 7, 7' of which have in their ends outputs 4, 4', and the input 2 is set in one of the branches 7, 7'.

The applicator of microwave plasma generator and the microwave plasma generator including this present applicator according to this invention can be used in many fields of human activity exploiting plasma and it is necessary to have a compact generator of small dimensions eliminating negative effects of the reflected component of microwave.

OVERVIEW OF REFERENCES 1 applicator
2 input of microwave
3 guiding part
4 first output
4' second output
5 microwave power source (magnetron)
6 cover
7 first branch
7' second branch
8 metal vacuum flange
9 plasma bulk
10 separation of the first output
10' separation of the second output
11 first aperture of the flange
11' second aperture of the flange
A distance of the input 2 from the first separation 10 of the first output 4
B distance of the input 2 from the second separation 10' of the second output 4'

The invention claimed is:

1. An applicator of microwave plasma generator comprising:
an input of microwave from a microwave power source
a guiding part of a closed profile; and
at least one output of microwave covered by a dielectric cover whose side reversed from the at least one output creates a separation between the applicator and a generated plasma bulk, wherein
the guiding part is provided on one of the guiding part ends by a first one of the at least one output, on a second end by a second of the at least one output and
wherein the input is placed in a wall of the guiding part a first distance from the separation of the first of the at least one output and a second distance from the separation of the second of the at least one output while the absolute value of the difference of the first and second distances equals $\lambda/2$ where $\lambda$ is the wave length of the microwave from the microwave power source and the first and second distances correspond to the trajectory of microwave propagation.

2. An applicator according to claim 1, wherein the guiding part is fixed to a metal vacuum flange defining apertures on the near side against the first and second outputs of the guiding part, wherein on the reverse side, the apertures are covered by at least one dielectric cover.

3. An applicator according to claim 2, wherein the guiding part has the shape of a hollow body abutting the metal vacuum flange and covering the apertures by first and second outputs.

4. An applicator according to claim 1, wherein the guiding part has a substantially "U-shaped" cross section, wherein the branches of the U-shaped cross section are provided with the first and second outputs in the ends and wherein the input is placed in one of the branches.

5. A microwave plasma generator comprising:
a microwave power source; and
an applicator, wherein
the microwave power source is connected to an input of a guiding part of the applicator,
wherein one end of the guiding part is provided with a first output,
wherein a second end of the guiding part is provided with a second output, and wherein both the first and second outputs are covered by dielectric covers, such that the sides of the covers reversed from the first and second outputs create separations between the applicator and a generated plasma bulks and
wherein the input is placed in a wall of the guiding part a first distance from the separation of the first output and a second distance from the separation of the second output while the absolute value of the difference of the distances equals $\lambda/2$ where $\lambda$ is the wave length of the microwave from the microwave power source and the first and second distance correspond to a trajectory of microwave propagation.

* * * * *